(12) United States Patent
Lee et al.

(10) Patent No.: US 7,782,647 B2
(45) Date of Patent: Aug. 24, 2010

(54) SEMICONDUCTOR MEMORY DEVICE

(75) Inventors: Eun-Souk Lee, Gyeonggi-do (KR);
Kang-Seol Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 166 days.

(21) Appl. No.: 12/204,190

(22) Filed: Sep. 4, 2008

(65) Prior Publication Data
US 2009/0059643 A1 Mar. 5, 2009

(30) Foreign Application Priority Data

Sep. 4, 2007 (KR) .................. 10-2007-0089644
Aug. 27, 2008 (KR) .................. 10-2008-0083862

(51) Int. Cl.
*G11C 5/06* (2006.01)
(52) U.S. Cl. .................. 365/72; 365/63; 365/230.06
(58) Field of Classification Search .................. 365/72, 365/63, 230.06
See application file for complete search history.

(56) References Cited

U.S. PATENT DOCUMENTS

| | | | |
|---|---|---|---|
| 5,768,201 A | 6/1998 | Oh | |
| 6,075,729 A * | 6/2000 | Ohhata et al. | 365/190 |
| 6,765,842 B2 | 7/2004 | Kim | |
| 6,873,536 B2 * | 3/2005 | Komatsuzaki | 365/145 |
| 7,002,862 B2 * | 2/2006 | Kang | 365/205 |
| 7,417,909 B2 * | 8/2008 | Byeon et al. | 365/203 |
| 7,660,176 B2 * | 2/2010 | Hur | 365/203 |
| 2004/0240293 A1 | 12/2004 | Lee | |

FOREIGN PATENT DOCUMENTS

| | | |
|---|---|---|
| JP | 2002-230978 | 8/2002 |
| KR | 1019980045797 A | 9/1998 |
| KR | 1020080061954 A | 7/2008 |

OTHER PUBLICATIONS

Notice of Allowance issued from Korean Intellectual Property Office on Dec. 28, 2009.

* cited by examiner

*Primary Examiner*—Connie C Yoha
(74) *Attorney, Agent, or Firm*—IP & T Law Firm PLC

(57) ABSTRACT

A semiconductor memory device has a simple layout pattern of a sub hole region. The semiconductor memory device includes a segment input/output line, a first local input/output line and a second local input/output line corresponding to the segment input/output line, an input/output switch configured to selectively connect the segment input/output line and the first local input/output line in response to a first switch control signal, and a dummy input/output switch which is connected to a second local input/output line but is not connected to the segment input/output line.

18 Claims, 15 Drawing Sheets

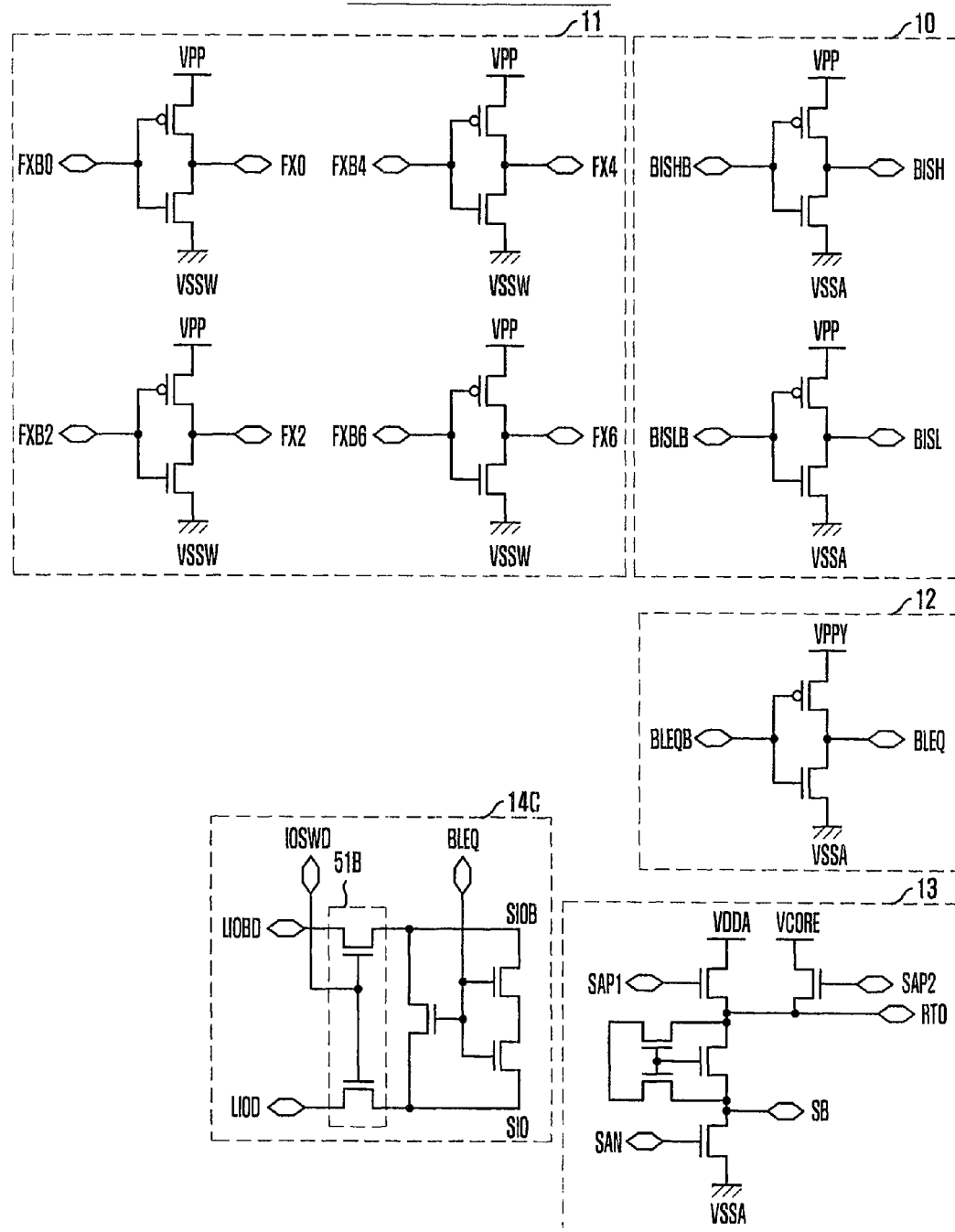

SUB HOLE REGION IN MIDDLE BANK ZONE 51B          51A

SUB HOLE REGION IN LOWER BANK ZONE

SUB HOLE REGION IN UPPER BANK ZONE 501C  501A

SUB HOLE REGION IN MIDDLE BANK ZONE 501B  501A

SUB HOLE REGION IN LOWER BANK ZONE 501B  501D

SEMICONDUCTOR MEMORY DEVICE

CROSS-REFERENCE(S) TO RELATED APPLICATIONS

The present invention claims priority of Korean patent application numbers 10-2007-0089644 & 10-2008-0083862, filed on Sep. 4, 2007 and Aug. 27, 2008, respectively, which are incorporated by reference in their entireties.

BACKGROUND OF THE INVENTION

The subject matter relates to a semiconductor memory device, and more particularly to a transistor layout in a sub hole region of a semiconductor memory device.

A semiconductor memory device such as a dynamic random access memory (DRAM) includes an interface region, a core region, and a hierarchical data bus structure for transferring data between the interface region and the core region. Segment input/output lines and local input/output lines are disposed in the core region, and global input/output lines are disposed from the interface region to the core region.

The configurations of the cell arrays and the data paths vary according to a size and a performance of a semiconductor memory device.

In a conventional cell array structure, data stored in a plurality of cells shares a single segment input/output line through respective bit line sense amplifiers (BLSA). For a shared bit line sense amplifier structure where the bit line sense amplifier array is shared between upper cell arrays and lower cell arrays, there are bit line connectors for selectively connecting the bit line sense amplifiers and the upper/lower bit lines. Accordingly, data in the two upper and lower cell array blocks sharing the bit line sense amplifier may also share the segment input/output line.

The segment input/output lines are connected to local input/output lines through input/output switches. This is aimed to prevent the segment input/output lines from being affected by a very high capacitance of the local input/output lines. Therefore, all the segment input/output lines are connected to local input/output lines through input/output switches.

The input/output switches are disposed in sub hole regions in the semiconductor memory device. The sub hole region refers to a region where a bit line sense amplifier array horizontally arranged between upper/lower cell arrays and a sub word line driver array vertically arranged between left/right cell arrays cross each other. A bit line sense amplifier drive circuit, a bit line control circuit and a sub word line control circuit, as well as the above described input/output switch, are disposed in the sub hole region.

FIGS. 1A, 1B, and 1C show a typical bank architecture of a semiconductor memory device. FIGS. 1A, 1B, and 1C are parts of a single diagram. That is, the top of FIG. 1B is coupled to the bottom of FIG. 1A and the bottom of FIG. 1B is coupled to the top of FIG. 5C, to form the single diagram.

Referring to FIGS. 1A, 1B, and 1C, a plurality of cell arrays (MAT) and sub word line driver arrays are disposed in a matrix form. Here, the bit line sense amplifier array is not shown for convenience.

Segment input/output lines SIO<0>/SIOB<0> and SIO<2>/SIOB<2> and segment input/output lines SIO<1>/SIOB<1> and SIO<3>/SIOB<3> are arrayed in a row direction on and under the cell array MAT, respectively. Local input/output lines LIOU<0>/LIOBU<0>, LIOU<1>/LIOBU<1>, LIOD<0>/LIOBD<0> and LIOD<1>/LIOBD<1>, and local input/output lines LIOU<2>/LIOBU<2>, LIOU<3>/LIOBU<3>, LIOD<2>/LIOBD<2> and LIOD<3>/LIOBD<3> are arrayed in a column direction between the cell arrays MAT, respectively.

Even if only the match up of the segment input/output lines SIO<0>/SIOB<0>, SIO<2>/SIOB<2>, SIO<1>/SIOB<1> and SIO<3>/SIOB<3> and the local input/output lines LIOU<0>/LIOBU<0>, LIOU<1>/LIOBU<1>, LIOD<0>/LIOBD<0> and LIOD<1>/LIOBD<1> are considered, the shapes of the input/output switches (disposed in the sub hole regions) connecting the segment input/output lines and the local input/output lines are different according to the bank zones.

In more detail, a middle bank zone includes a first input/output switch 51A for connecting the segment input output lines SIO and SIOB and the upper local input/output lines LIOU and LIOBU, and a second input/output switch 51B for connecting the segment input/output lines SIO and SIOB and the lower local input/output lines LIOD and LIOBD.

An upper bank zone includes only the first input/output switch 51A for connecting the segment input output lines SIO and SIOB and the upper local input/output lines LIOU and LIOBU.

A lower bank zone includes only a second input/output switch 51B for connecting the segment input/output lines SIO and SIOB and the lower local input/output lines LIOD and LIOBD.

For reference, precharging units LIO PRECHARGE are disposed at upper ends of the local input/output lines, respectively, in the upper bank zone.

FIGS. 2A, 2B, and 2C are circuit diagrams showing conventional sub hole regions of respective bank zones.

Each sub hole region includes a bit line separation signal (BISH and BISL) generation circuit 10, a sub word line drive signal (FX0, FX2, FX4 and FX6) generation circuit 11, a bit line equalizing signal (BLEQ) generation circuit 12, a bit line sense amplifier drive circuit 13, and one of input/output switch circuits 14A, 14B and 14C. Here, the circuits for the bit line separation signal (BISH and BISL) generation circuit 10, the sub word line drive signal (FX0, FX2, FX4 and FX6) generation circuit 11, the bit line equalizing signal (BLEQ) generation circuit 12, and the bit line sense amplifier drive circuit 13 are the same, respectively, regardless of the bank zones in which they are located.

Referring to FIG. 2A, the input/output switch circuit 14A disposed in the sub hole region in the upper bank zone includes transistors (three NMOS transistors each receiving the bit line equalizing signal BLEQ at their gates) for equalizing/precharging the segment input/output lines SIO and SIOB, and a first input/output switch 51A for connecting the segment input/output lines SIO and SIOB and the upper local input/output lines LIOU and LIOBU in response to an upper switch control signal IOSWU. This is because the connection between the lower local input/output lines LIOD and LIOBD and the segment input/output lines SIO and SIOB is not required in the upper bank zone. The first input/output switch 51A includes two NMOS transistors with gates for receiving the upper switch control signal IOSWU and sources/drains connected to the segment input/output lines SIO and SIOB and the upper local input/output lines LIOU and LIOBU.

Referring to FIG. 2B, the input/output switch circuit 14B disposed in the sub hole region in the middle bank zone includes transistors for equalizing/precharging the segment input/output lines SIO and SIOB, the first input/output switch 51A and a second input/output switch 51B. This is because the connection from the segment input/output lines SIO and SIOB to the upper local input/output lines LIOU and LIOBU and the lower local input/output lines LIOD and LIOBD is required in the middle bank zone. The second input/output switch 51B includes two NMOS transistors with gates for receiving the lower switch control signal IOSWD and sources/drains connected to the segment input/output lines SIO and SIOB and the lower local input/output lines LIOD and LIOBD.

Referring to FIG. 2C, the input/output switch circuit 14C disposed in the sub hole region in the lower bank zone includes transistors for equalizing/precharging the segment input/output lines SIO and SIOB, and the second input/output switch 51B for connecting the segment input/output lines SIO and SIOB and the lower local input/output lines LIOD and LIOBD in response to the lower switch control signal IOSWD. This is because the connection between the upper local input/output lines LIOU and LIOBU and the segment input/output lines SIO and SIOB is not required in the lower bank zone.

As described above, the circuits for the input/output switch circuits 14A, 14B, and 14C disposed in the sub hole regions are different according to the bank zones.

FIGS. 3A, 3B, and 3C are diagrams showing pattern layouts of sub hole regions of FIGS. 2A, 2B, and 2C, respectively. Here, a plurality of rectangles highlighted by light colors represent transistors.

As can be seen in FIGS. 3A, 3B, and 3C, the layouts of the sub hole regions are different according to the upper bank zone, the middle bank zone and the lower bank zone.

That is, the sub hole region in the upper bank zone includes only the first input/output switch 51A and does not include the second input/output switch 51B. Accordingly, the area A for the second input/output switch 51B is occupied with a vacant space or another pattern.

On the contrary, the sub hole region in the lower bank zone includes only the second input/output switch 51B and does not include the first input/output switch 51A. Accordingly, the area B for the first input/output switch 51A is occupied with a vacant space or another pattern.

Resultantly, a single bank needs a variety of layouts for sub hole regions including the input/output switch circuits 14A, 14B, and 14C.

In this case, the variety of the layout patterns may decrease the layout efficiency and increase an operation time during manufacturing. Furthermore, the variety of the layout patterns may cause operation errors in a mask process. As a result, productivity and device reliability may be decreased.

SUMMARY OF THE INVENTION

Embodiments of the present invention are directed to providing a semiconductor memory device with a simple layout pattern of a sub hole region.

In accordance with an aspect of the present invention, there is provided a semiconductor memory device, which includes a segment input/output line, a first local input/output line and a second local input/output line corresponding to the segment input/output line, an input/output switch configured to selectively connect the segment input/output line and the first local input/output line in response to a first switch control signal, and a dummy input/output switch which is connected to a second local input/output line but is not connected to the segment input/output line.

In accordance with another aspect of the present invention, there is provided a semiconductor memory device with a plurality of sub hole regions where a sub word line driver block and a bit line sense amplifier block cross each other, which includes a first sub hole region including a first input/output switch configured to selectively connect a first segment input/output line and a first local input/output line in response to a first switch control signal, and a second input/output switch configured to selectively connect the first segment input/output line and a second local input/output line in response to a second switch control signal, and a second sub hole region including a third input/output switch configured to selectively connect a second segment input/output line and the first local input/output line in response to the first switch control signal, and a first dummy input/output switch which is connected to the second local input/output line but is not connected to the second segment input/output line.

According to exemplary embodiment of the present invention, input/output switch circuits of all sub hole regions have the same pattern of transistors regardless of the bank zones in which they are located. That is, a pattern for an input/output switch circuit of a middle bank zone can also be applied to an upper bank zone and a lower bank zone. To this end, in each of the sub hole regions in the upper bank zone and the lower bank zone, dummy input/output switches which are not connected to the segment input/output lines are disposed. Preferably, the dummy input/output switches are applied with a predetermined power supply voltage without being floated so as to prevent malfunctions.

BRIEF DESCRIPTION OF THE DRAWINGS

FIGS. 2A, 2B, and 2C are circuit diagrams showing conventional sub hole regions of respective bank zones.

DETAILED DESCRIPTION

Hereinafter, a semiconductor memory device in accordance with the present invention will be described in detail with reference to the accompanying drawings.

Figure 4A:
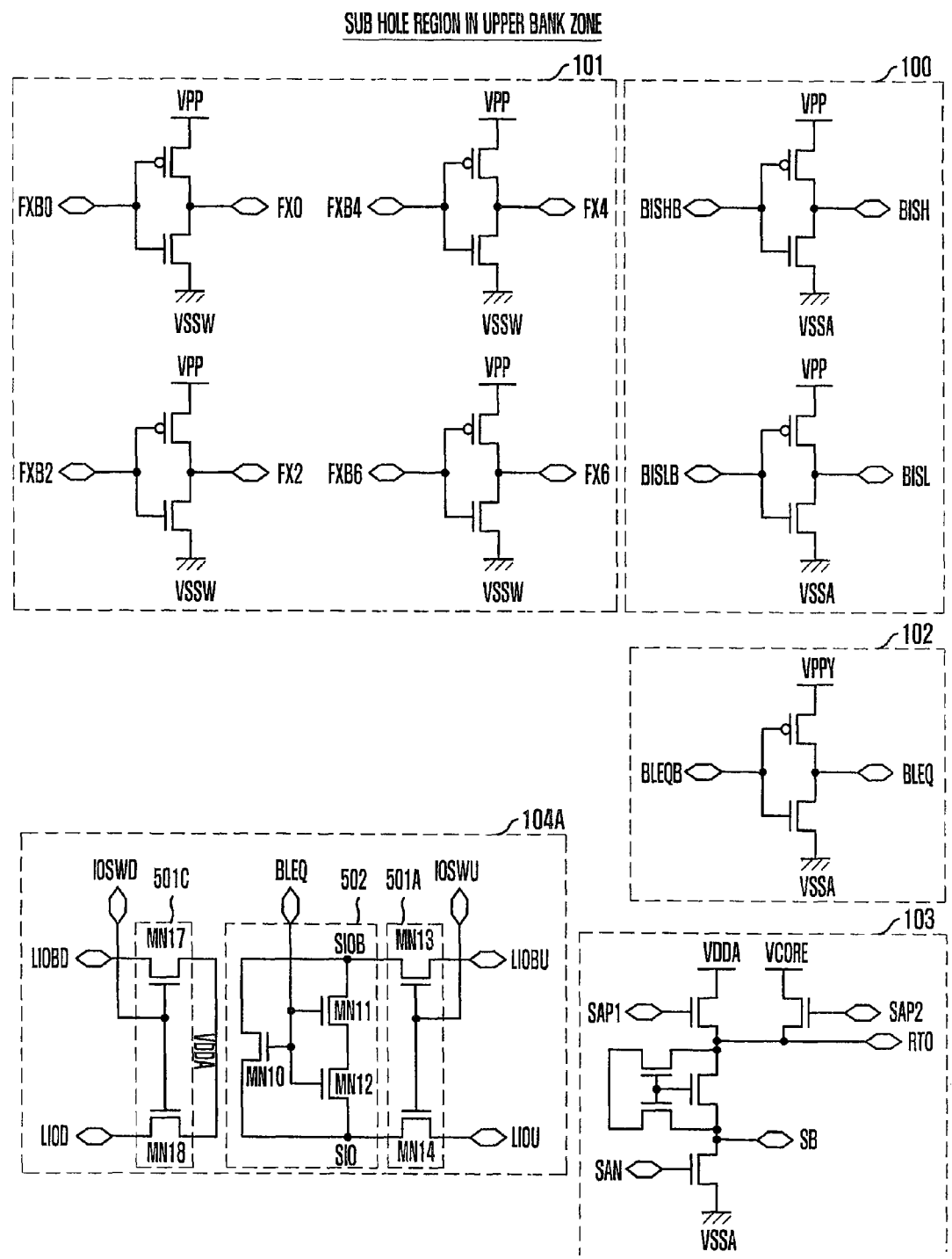
FIGS. 4A, 4B, and 4C are circuit diagrams illustrating sub hole regions of respective bank zones in accordance with an embodiment of the present invention.
Figure 4B:
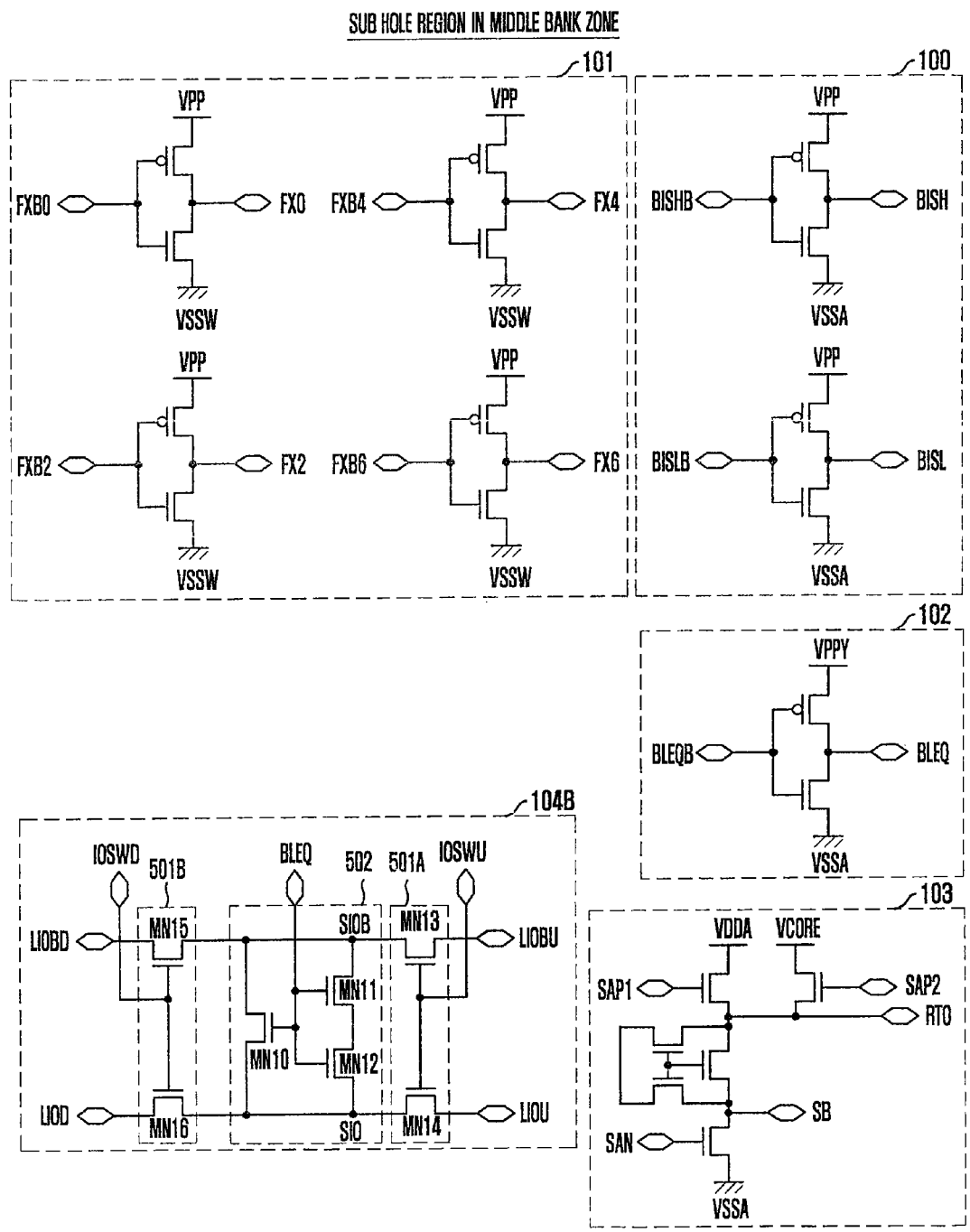
Figure 4C:
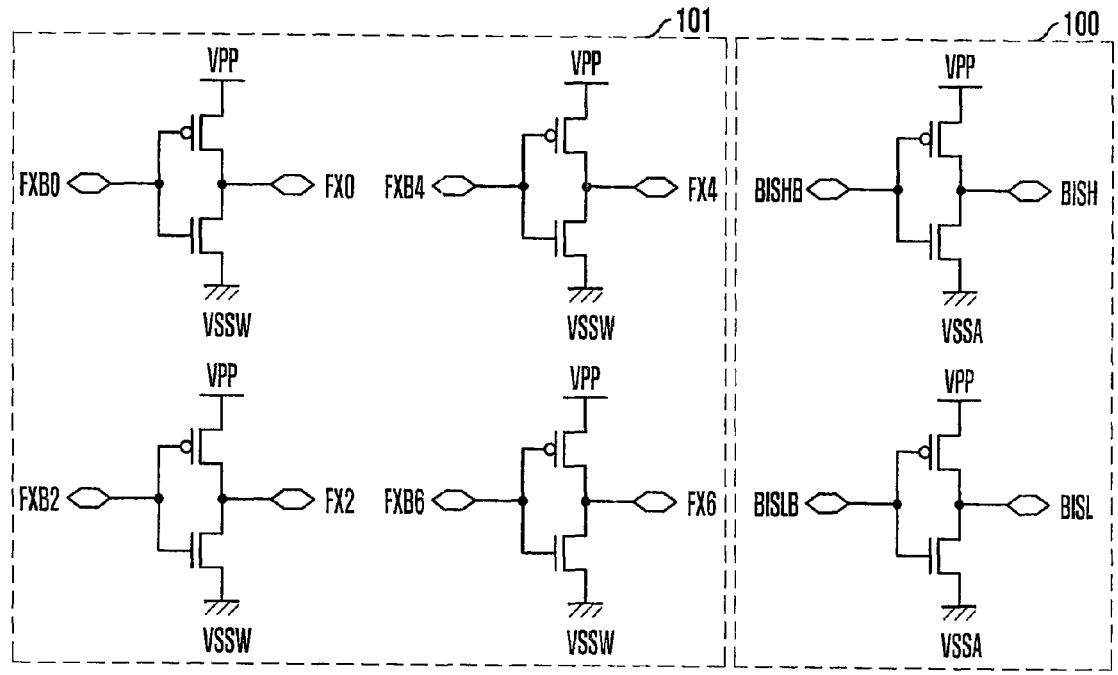
Figure 4C:
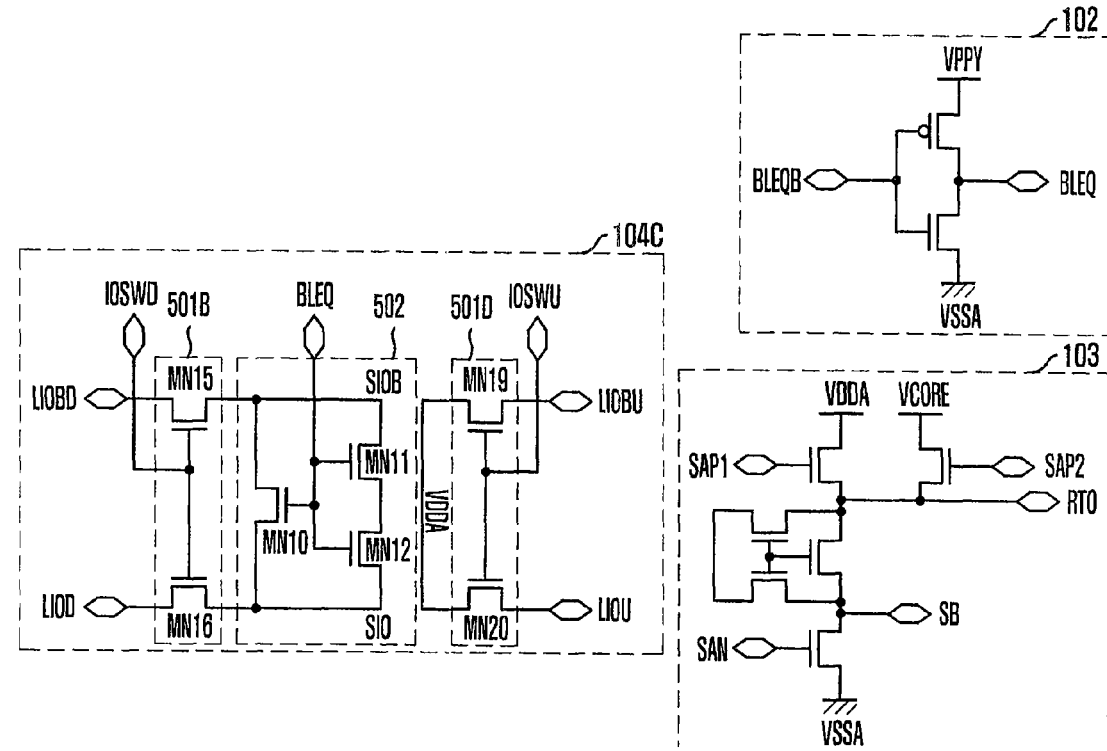

FIGS. 4A, 4B, and 4C are circuit diagrams illustrating sub hole regions of respective bank zones, in accordance with an embodiment of the present invention.

The sub hole regions each include a bit line separation signal (BISH and BISL) generation circuit 100, a sub word line drive signal (FX0, FX2, FX4 and FX6) generation circuit 101, a bit line equalizing signal (BLEQ) generation circuit 102, a bit line sense amplifier drive circuit 103, and one of input/output switch circuits 104A, 104B and 104C. Here, the circuits for the bit line separation signal (BISH and BISL) generation circuit 100, the sub word line drive signal (FX0, FX2, FX4 and FX6) generation circuit 101, the bit line equalizing signal (BLEQ) generation circuit 102, and the bit line sense amplifier drive circuit 103 are the same, respectively, regardless of the bank zones in which they are located.

Figure 1A:
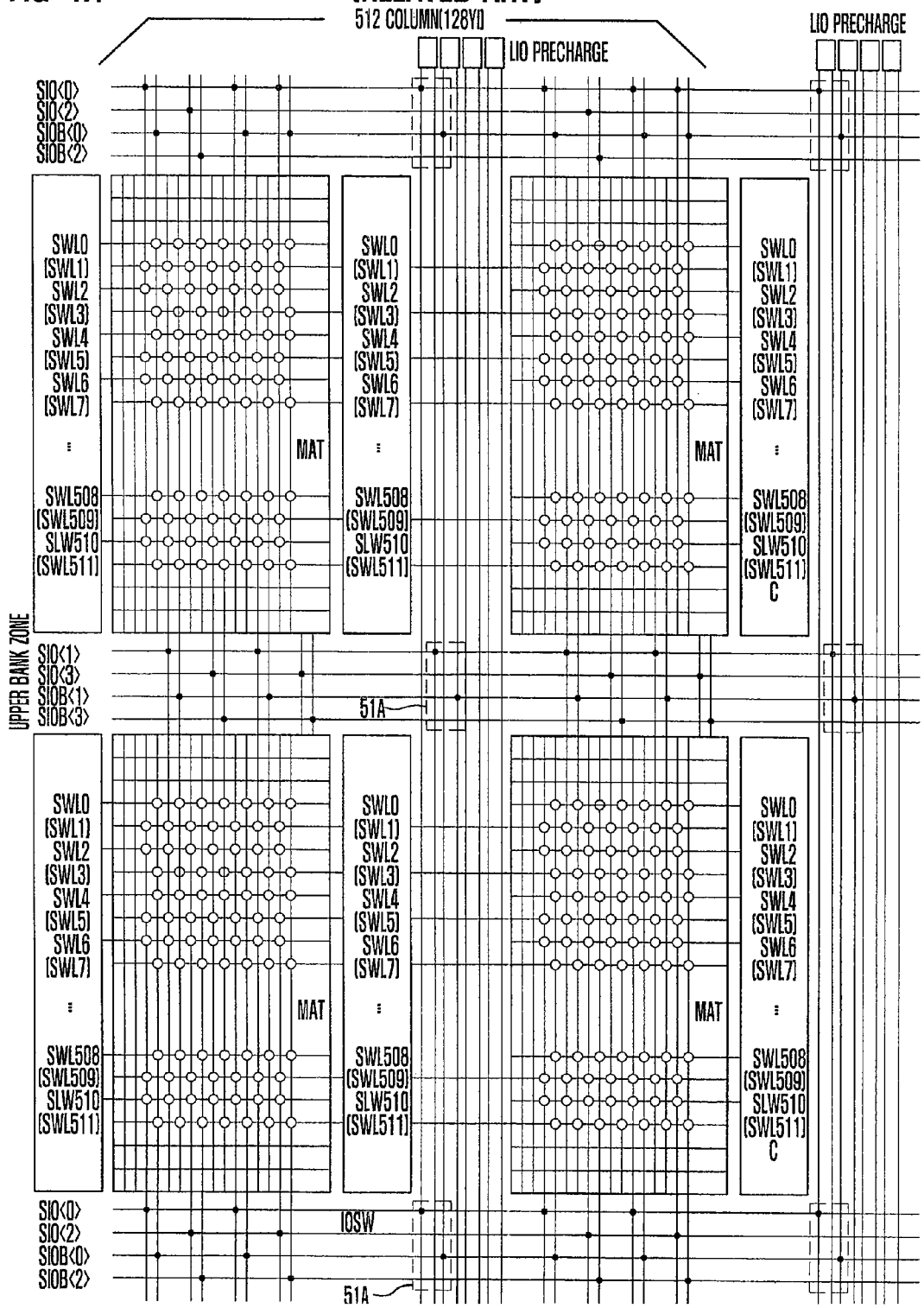
FIGS. 1A, 1B, and 1C are diagrams showing a typical bank architecture of a semiconductor memory device.
Figure 1B:
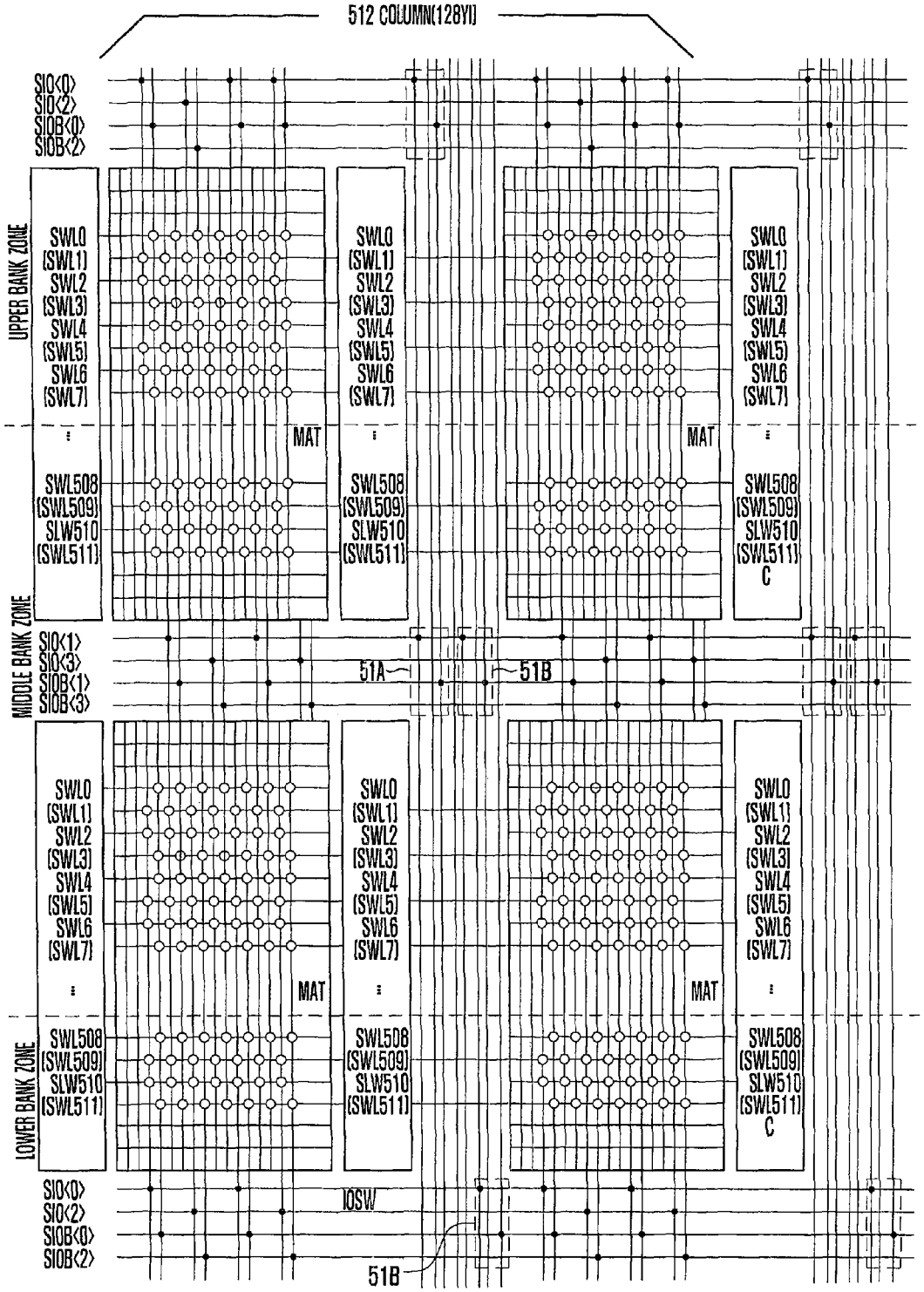
Figure 1C:
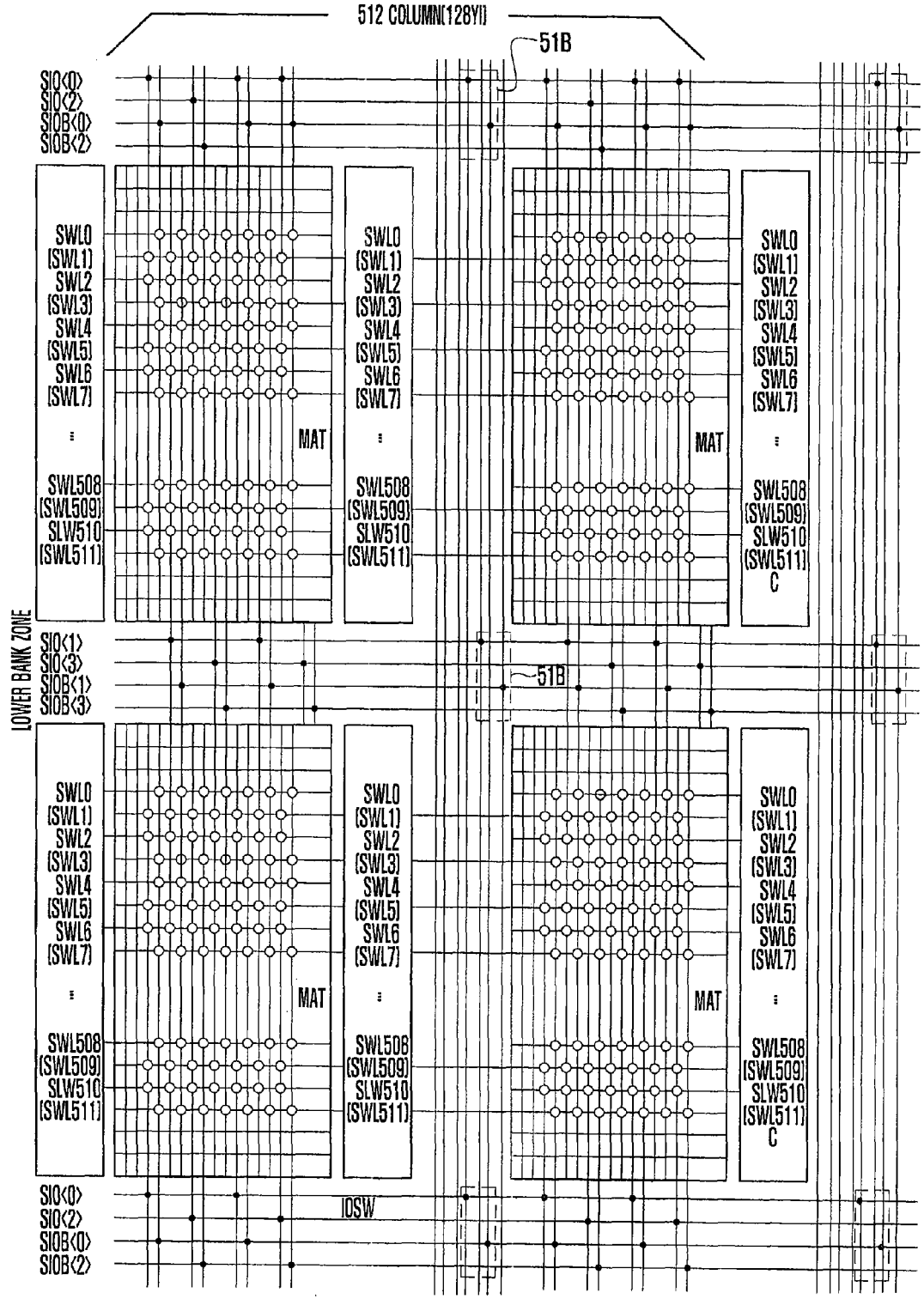
Figure 2A:
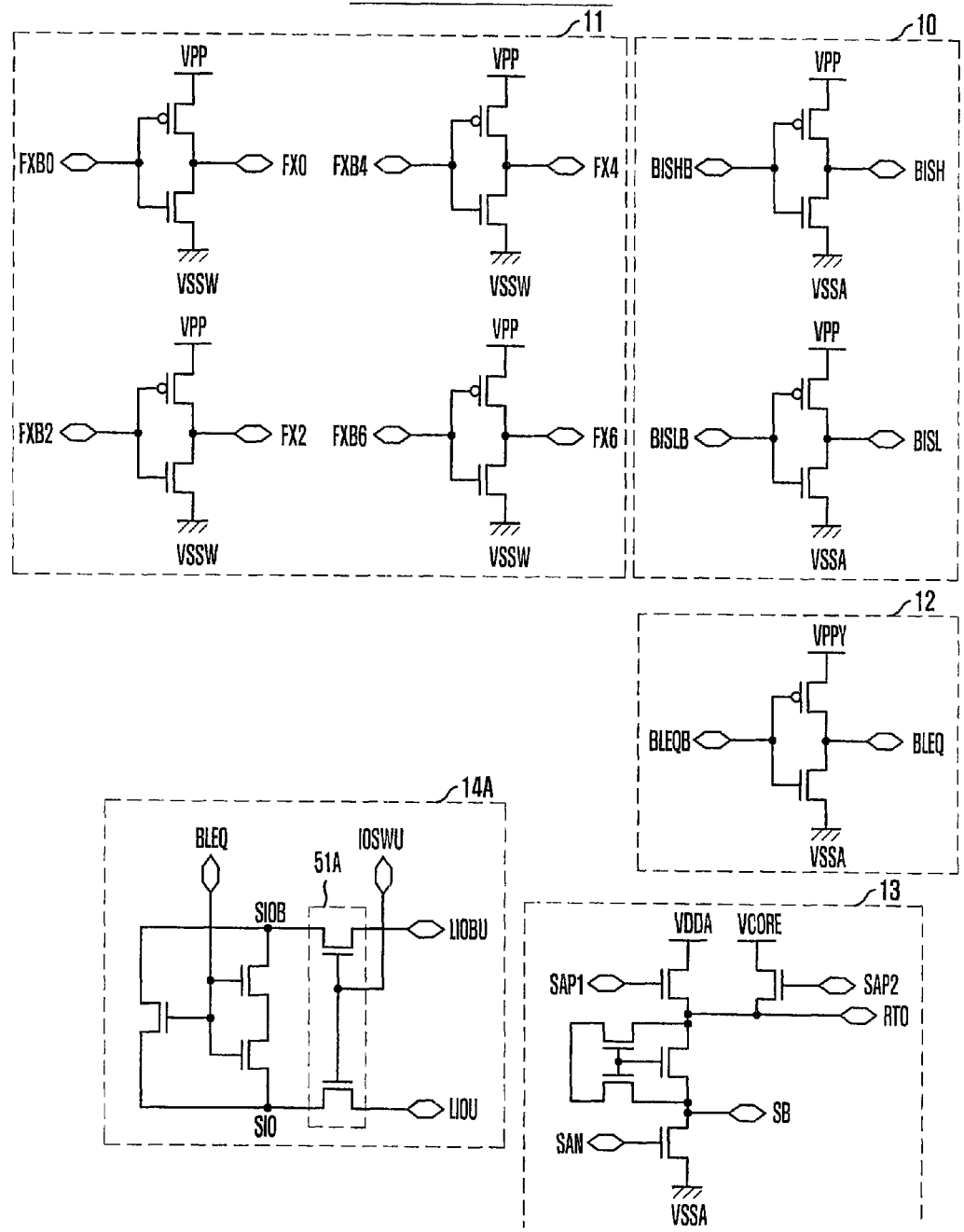
Figure 2B:
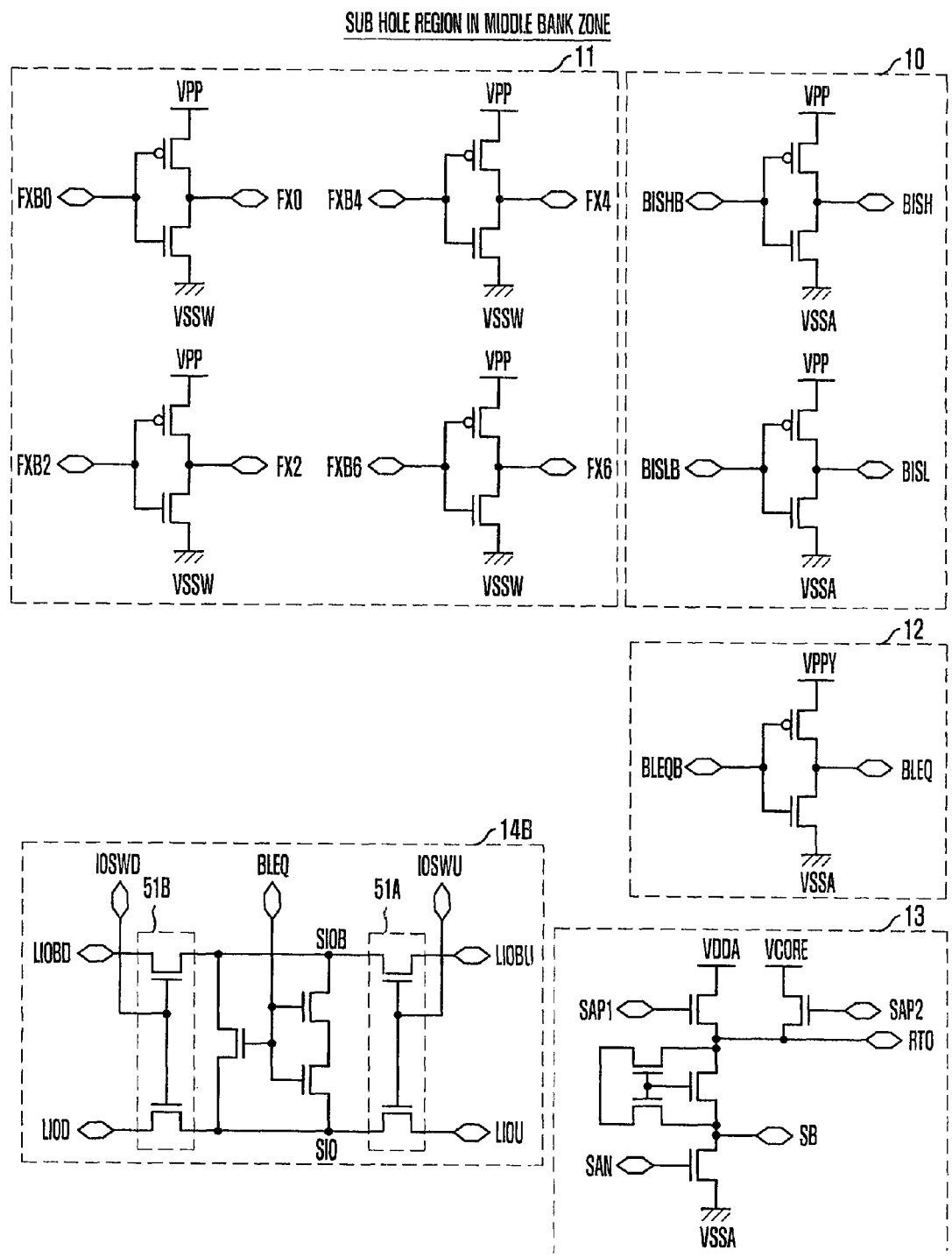
Figure 3A:
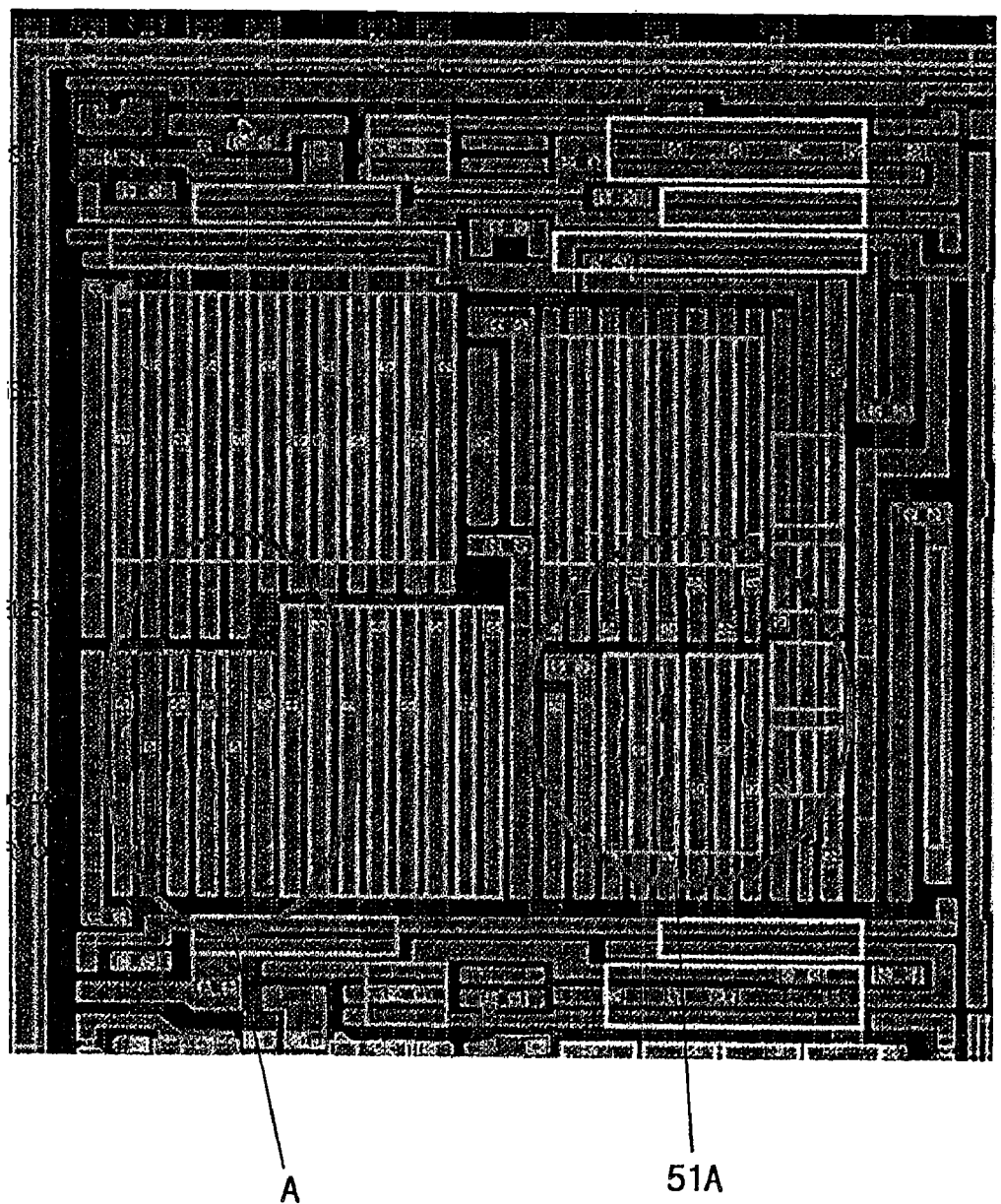
FIGS. 3A, 3B, and 3C are diagrams showing pattern layouts of sub hole regions of FIGS. 2A, 2B, and 2C, respectively.
Figure 3B:
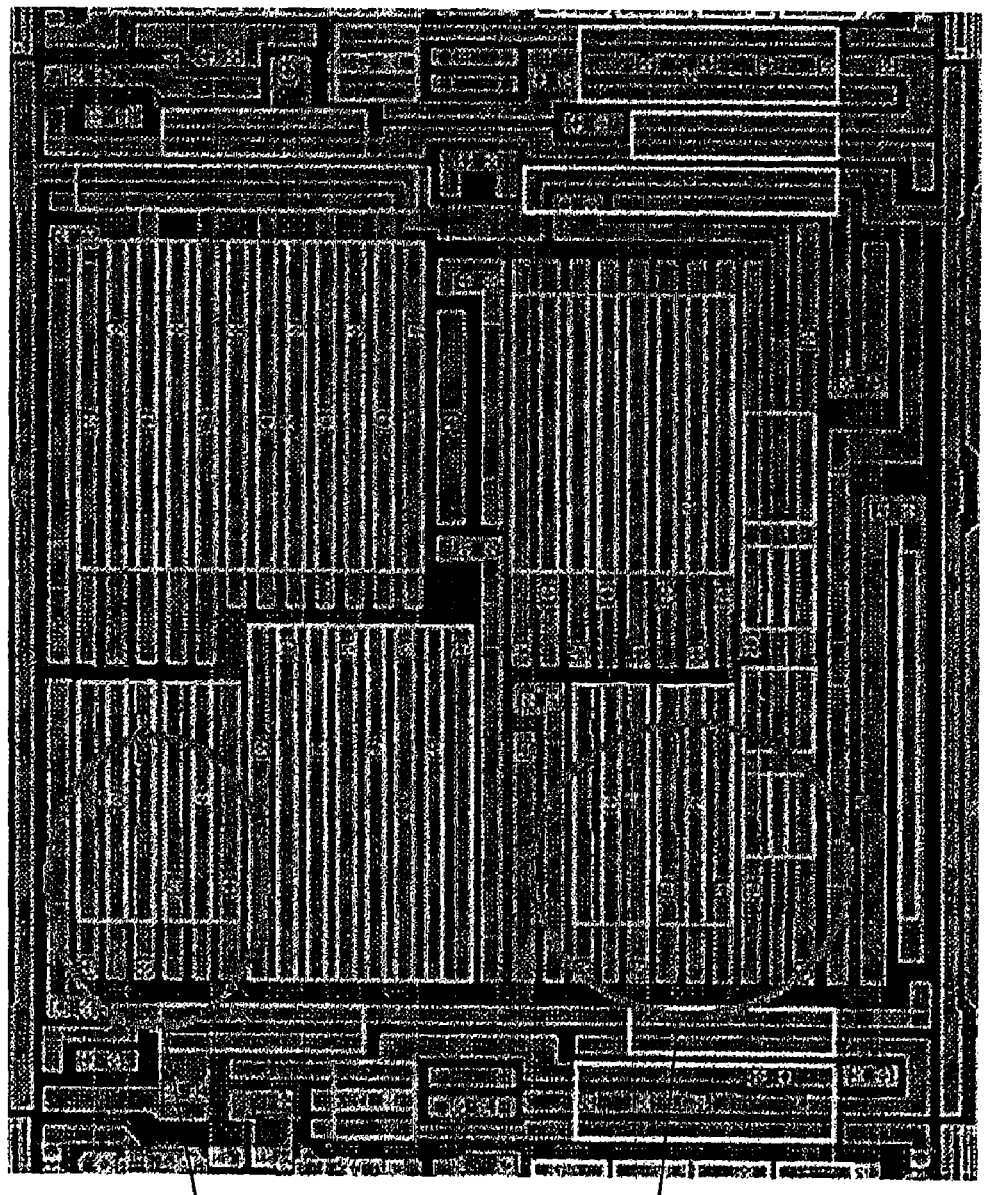
Figure 3C:
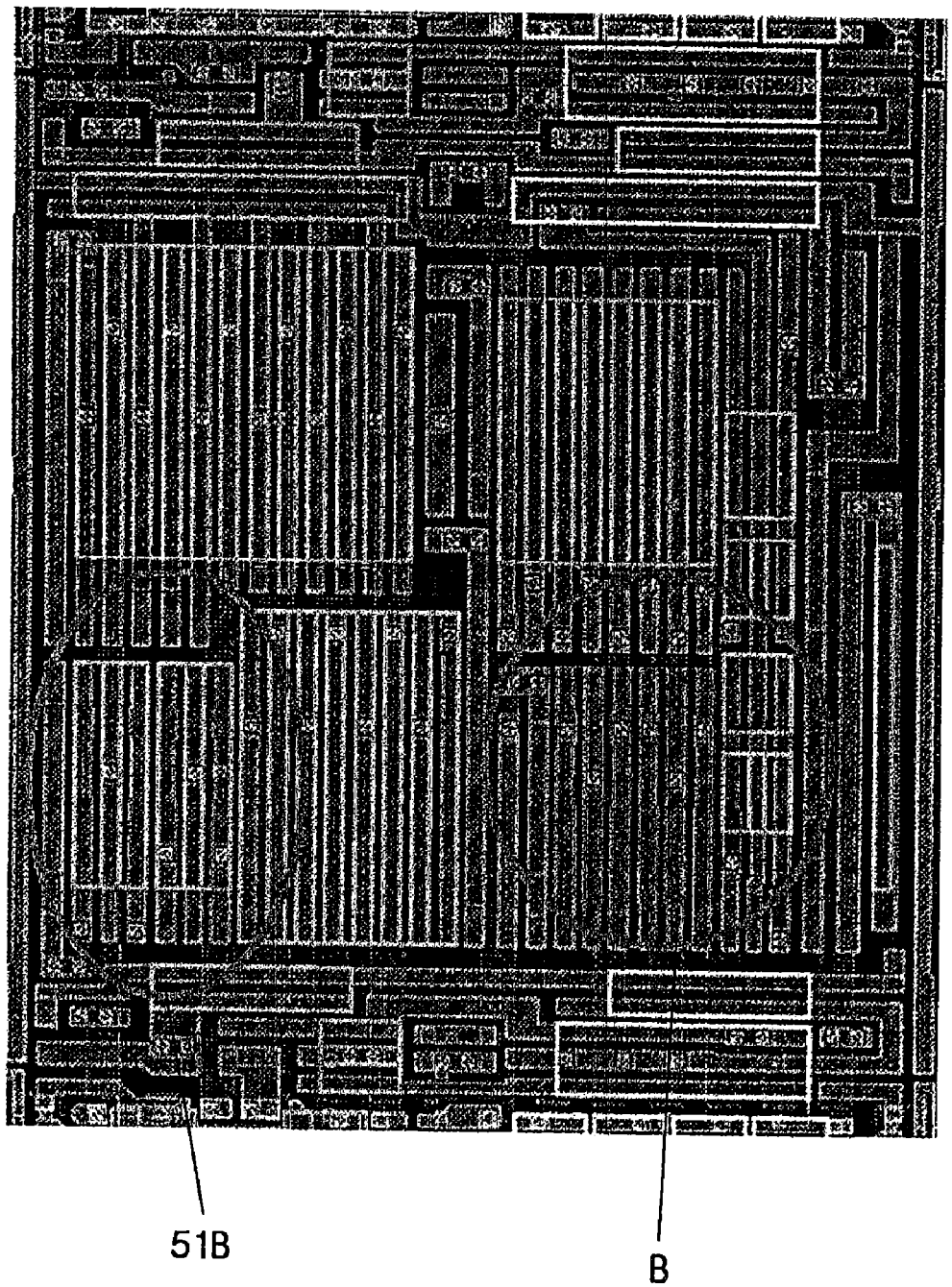

Referring to FIG. 4B, the input/output switch circuit 104B disposed in a sub hole region in a middle bank zone includes a first input/output switch 501A and a second input/output switch 501B, together with a segment input/output line equalizing/precharging unit 502, which is the same as the conventional input/output switch circuit 14B shown in FIG. 2B.

Here, the segment input/output line equalizing/precharging unit 502 includes NMOS transistors MN10, MN11 and MN12. The NMOS transistor MN10 receives a bit line equalizing signal BLEQ at a gate, and its source and drain are connected to a segment input/output lines SIO and a segment input/output lines SIOB. The NMOS transistor MN11 has a gate configured to receive the bit line equalizing signal BLEQ, a source connected to the segment input/output line SIOB, and a drain connected to a precharge voltage VPCG. The NMOS transistor MN12 has a gate configured to receive the bit line equalizing signal BLEQ, a source connected to the segment input/output lines S10, and a drain connected to the precharge voltage VPCG.

The first input/output switch 501A includes NMOS transistors MN14 and MN13. The NMOS transistor MN14 receives an upper switch control signal IOSWU at a gate, and its source and drain are connected to the segment input/output line SIO and an upper local input/output line LIOU. The NMOS transistor MN13 receives the upper switch control signal IOSWU at a gate, and its source and drain are connected to the segment input/output line SIOB and an upper local input/output line LIOBU.

The second input/output switch 501B includes NMOS transistors MN16 and MN15. The NMOS transistor MN16 receives a lower switch control signal IOSWD at a gate, and its source and drain are connected to the segment input/output line SIO and a lower local input/output line LIOD. The NMOS transistor MN15 receives the lower switch control signal IOSWD at a gate, and its source and drain are connected to the segment input/output line SIOB and a lower local input/output line LIOBD.

Referring to FIG. 4A, the input/output switch circuit 104A disposed in a sub hole region in an upper bank zone includes the first input/output switch 501A, as described above with respect to FIG. 4B, and a dummy second input/output switch 501C, together with the segment input/output line equalizing/precharging unit 502, as described above with respect to FIG. 4B. The first input output switch 501A is configured to connect the segment input/output lines SIO and SIOB and the upper local input/output lines LIOU and LIOBU in response to the upper switch control signal IOSWU. The dummy second input/output switch 501C is not connected to the segment input/output lines SIO and SIOB.

Basically, the connection between the segment input/output lines SIO and SIOB and the lower local input/output lines LIOD and LIOBD is not required in the upper bank zone. However, the addition of the dummy second input/output switch 501C, which is not connected to the segment input/output lines SIO and SIOB, to the upper bank zone makes it possible to apply a layout identical to that of the middle bank zone to the upper bank zone.

The dummy second input/output switch 501C includes NMOS transistors MN18 and MN17. The NMOS transistor MN18 has a gate configured to receive the lower switch control signal IOSWD, a source connected to the lower local input/output line LIOD, and a drain connected to a power supply voltage VDDA. The NMOS transistor MN17 has a gate configured to receive the lower switch control signal IOSWD, a source connected to the lower local input/output line LIOBD, and a drain connected to the power supply voltage VDDA.

Referring to FIG. 4C, the input/output switch circuit 104C disposed in a sub hole region in a lower bank zone includes the second input/output switch 501B and a dummy first input/output switch 501D, together with the segment input/output line equalizing/precharging unit 502. The second input output switch 501B is configured to connect the segment input/output lines SIO and SIOB and the lower local input/output lines LIOD and LIOBD in response to the lower switch control signal IOSWD. The dummy first input/output switch 501D is not connected to the segment input/output lines SIO and SIOB.

Basically, the connection between the segment input/output lines SIO and SIOB and the upper local input/output lines LIOU and LIOBU is not required in the lower bank zone. However, the addition of the dummy first input/output switch 501D, which is not connected to the segment input/output lines SIO and SIOB, to the lower bank zone makes it possible to apply a layout identical to that of the middle bank zone to the lower bank zone.

The dummy first input/output switch 501D includes NMOS transistors MN20 and MN19. The NMOS transistor MN20 has a gate configured to receive the upper switch control signal IOSWU, a source connected to the upper local input/output line LIOU, and a drain connected to a power supply voltage VDDA. The NMOS transistor MN19 has a gate configured to receive the upper switch control signal IOSWU, a source connected to the upper local input/output line LIOBU, and a drain connected to the power supply voltage VDDA.

It matters little whether the dummy first input/output switch 501D and the dummy second input/output switch 501C are floated because the segment input/output lines SIO and SIOB and the local input output lines corresponding to them do not participate in the actual data transfer. However, they are preferably terminated with the power supply voltage VDDA so as to prevent malfunctions of the transistors.

Figure 5A:
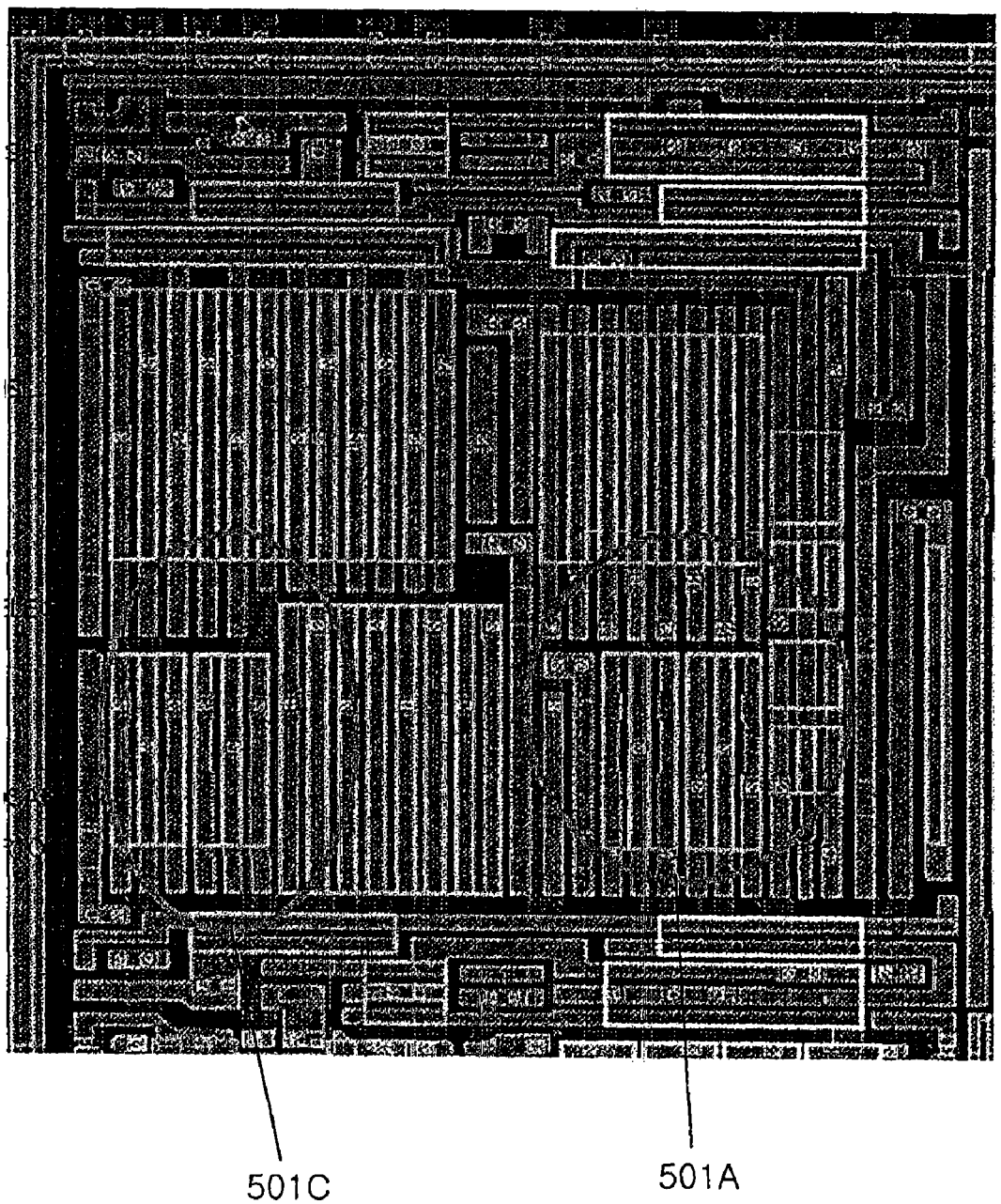
FIGS. 5A, 5B, and 5C are diagrams illustrating pattern layouts of sub hole regions of FIGS. 4A, 4B, and 4C, respectively.
Figure 5B:
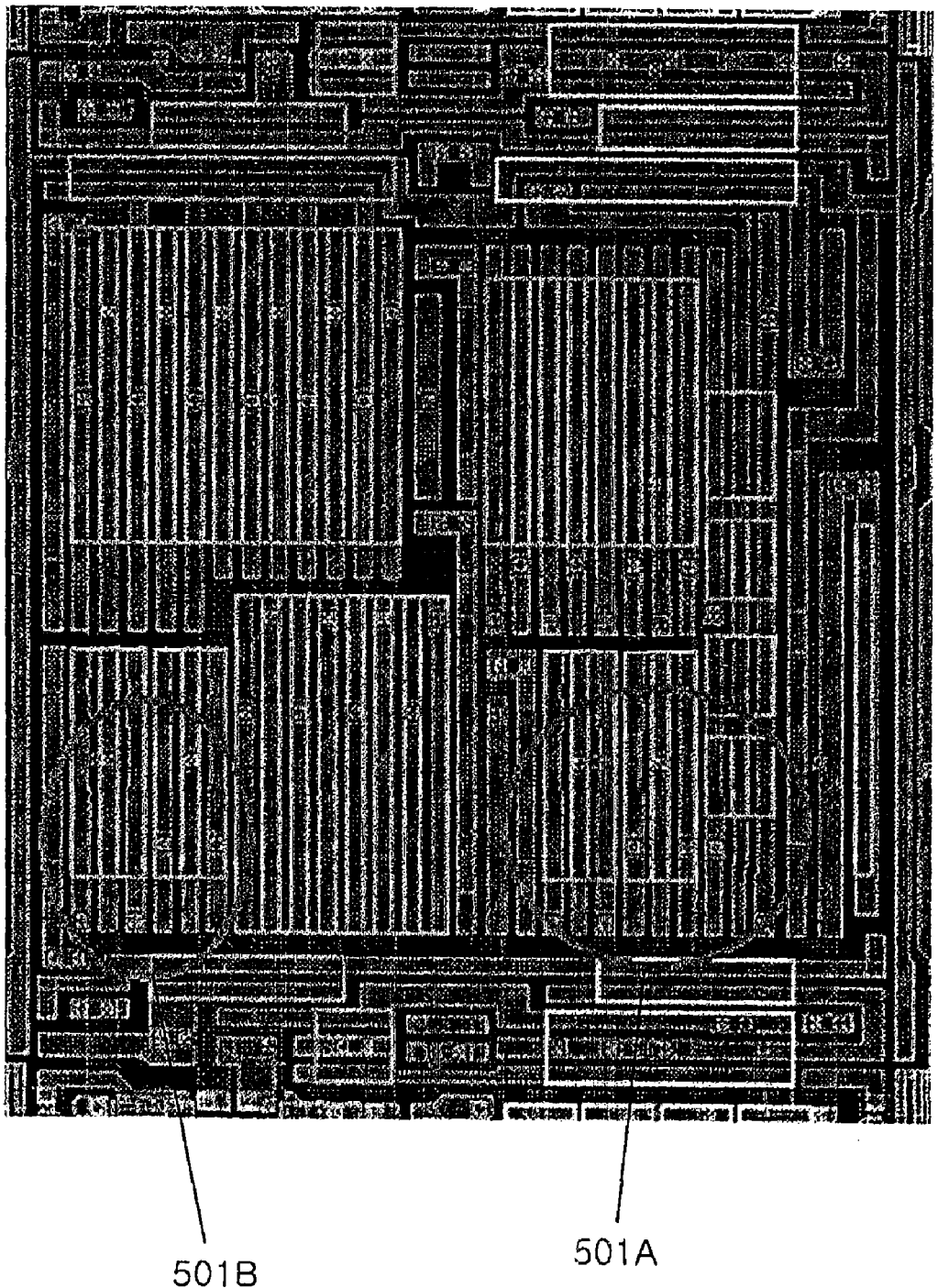
Figure 5C:
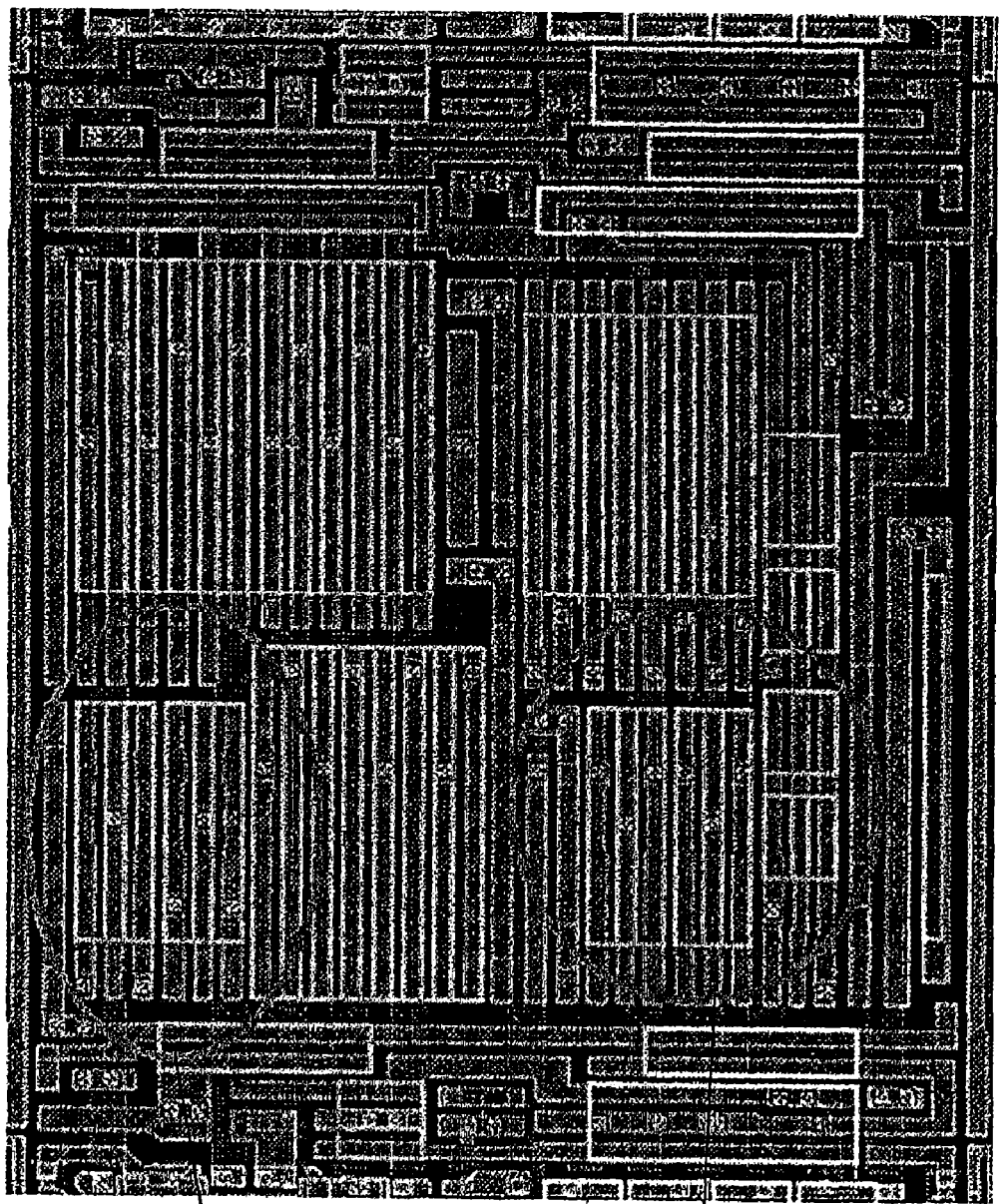

FIGS. 5A, 5B, and 5C are diagrams illustrating pattern layouts of sub hole regions of FIGS. 4A, 4B, and 4C, respectively. Here, a plurality of rectangles highlighted by light colors represent transistors.

From FIGS. 5A, 5B, and 5C, it can be seen that the pattern layouts of the transistors are identical.

That is, the dummy first input/output switch 501D and the dummy second input/output switch 501C allow all the sub hole regions to have the same layout pattern regardless of the bank zones in which they are located, except a portion of the contact patterns.

In other words, the arrangement of the transistors in the sub hole region is the same regardless of the bank zones in which the sub hole regions are located. In addition, the power supply voltage VDDA is applied to the dummy first input/output switch 501D and the dummy second input/output switch 501C, which are not connected to segment input/output lines SIO and SIOB. Accordingly, the contact patterns are somewhat different from each other.

According to the above described exemplary embodiments, the design patterns of all the sub hole regions are simplified. As such, the layout working time can be reduced, and, because of the repetition of the identical pattern, the process error can also be reduced. Resultantly, it is possible to improve the productivity and the device reliability.

While the present invention has been described with respect to the specific embodiments, it will be apparent to those skilled in the art that various changes and modifications may be made without departing from the spirit and scope of the invention as defined in the following claims.

For example, in the above described embodiments, the kind and the arrangement of the logic is, for example, based on the case where the input signal and the output signal are both high active signals. Accordingly, if the active polarity of the signal is changed, the logic may also be implemented differently. Although the number of such implementations is large, such implementations can be easily designed from the above description of specific embodiments by those skilled in the art, thus direct descriptions thereof are omitted herein.

In addition, in the above exemplary embodiments, the non-used dummy input/output switch is described to be terminated with the power supply voltage VDDA. However, the present invention is not limited thereto. For example, the non-used dummy input/output switch may also be terminated with a power supply voltage other than the power supply voltage VDDA, or be floated.

What is claimed is:

1. A semiconductor memory device, comprising:
   a segment input/output line;
   a first local input/output line and a second local input/output line, each corresponding to the segment input/output line;
   an input/output switch configured to selectively connect the segment input/output line and the first local input/output line in response to a first switch control signal; and
   a dummy input/output switch which is connected to a second local input/output line but is not connected to the segment input/output line.

2. The semiconductor memory device as recited in claim 1, wherein the segment input/output line and the first and second local input/output lines each includes a differential line having a positive line and a negative line.

3. The semiconductor memory device as recited in claim 2, wherein the input/output switch includes:
   a first MOS transistor having a source and a drain respectively connected to the positive line of the segment input/output line and the positive line of the first local input/output line, and a gate configured to receive the first switch control signal; and
   a second MOS transistor having a source and a drain respectively connected to the negative line of the segment input/output line and the negative line of the first local input/output line, and a gate configured to receive the first switch control signal.

4. The semiconductor memory device as recited in claim 3, wherein the dummy input/output switch includes:
   a third MOS transistor having a gate configured to receive a second switch control signal, and a source connected to the positive line of the second local input/output line; and
   a fourth MOS transistor having a gate configured to receive the second switch control signal, and a source connected to the negative line of the second local input/output line.

5. The semiconductor memory device as recited in claim 4, wherein drains of the third and fourth MOS transistors are connected to a power supply voltage.

6. A semiconductor memory device with a plurality of sub hole regions where a sub word line driver block and a bit line sense amplifier block cross each other, the semiconductor memory device comprising:
   a first sub hole region including a first input/output switch configured to selectively connect a first segment input/output line and a first local input/output line in response to a first switch control signal, and a second input/output switch configured to selectively connect the first segment input/output line and a second local input/output line in response to a second switch control signal; and
   a second sub hole region including a third input/output switch configured to selectively connect a second segment input/output line and the first local input/output line in response to the first switch control signal, and a first dummy input/output switch which is connected to the second local input/output line but is not connected to the second segment input/output line.

7. The semiconductor memory device as recited in claim 6, further comprising a third sub hole region including a fourth input/output switch configured to selectively connect a third segment input/output line and the second local input/output line in response to the second switch control signal, and a second dummy input/output switch which is connected to the first local input/output line but is not connected to the third segment input/output line.

8. The semiconductor memory device as recited in claim 7, wherein the first, second and third segment input/output lines and the first and second local input/output lines each includes a differential line having a positive line and a negative line.

9. The semiconductor memory device as recited in claim 8, wherein the first input/output switch includes:
   a first MOS transistor having a source and a drain respectively connected to the positive line of the first segment input/output line and the positive line of the first local input/output line, and a gate configured to receive the first switch control signal; and
   a second MOS transistor having a source and a drain respectively connected to the negative line of the first segment input/output line and the negative line of the first local input/output line, and a gate configured to receive the first switch control signal.

10. The semiconductor memory device as recited in claim 9, wherein the second input/output switch includes:
    a third MOS transistor having a source and a drain respectively connected to the positive line of the first segment input/output line and the positive line of the second local input/output line, and a gate configured to receive the second switch control signal; and
    a fourth MOS transistor having a source and a drain respectively connected to the negative line of the first segment input/output line and the negative line of the second local input/output line, and a gate configured to receive the second switch control signal.

11. The semiconductor memory device as recited in claim 8, wherein the third input/output switch includes:
    a first MOS transistor having a source and a drain respectively connected to the positive line of the second segment input/output line and the positive line of the first local input/output line, and a gate configured to receive the first switch control signal; and
    a second MOS transistor having a source and a drain respectively connected to the negative line of the second segment input/output line and the negative line of the first local input/output line, and a gate configured to receive the first switch control signal.

12. The semiconductor memory device as recited in claim 11, wherein the first dummy input/output switch includes:
    a third MOS transistor having a gate configured to receive the second switch control signal, and a source connected to the positive line of the second local input/output line; and
    a fourth MOS transistor having a gate configured to receive the second switch control signal, and a source connected to the negative line of the second local input/output line.

13. The semiconductor memory device as recited in claim 12, wherein drains of the third and fourth MOS transistors are connected to a power supply voltage.

14. The semiconductor memory device as recited in claim 8, wherein the fourth input/output switch includes:
    a first MOS transistor having a source and a drain respectively connected to the positive line of the third segment input/output line and the positive line of the second local input/output line, and a gate configured to receive the second switch control signal; and a second MOS transistor having a source and a drain respectively connected to the negative line of the third segment input/output line and the negative line of the second local input/output line, and a gate configured to receive the second switch control signal.

15. The semiconductor memory device as recited in claim 14, wherein the second dummy input/output switch includes:
a third MOS transistor having a source connected to the positive line of the first local input/output line, and a gate configured to receive the first switch control signal; and
a fourth MOS transistor having a source connected to the negative line of the first local input/output line, and a gate configured to receive the first switch control signal.

16. The semiconductor memory device as recited in claim 15, wherein drains of the third and fourth MOS transistors are connected to a power supply voltage.

17. The semiconductor memory device as recited in claim 6, wherein a layout pattern for all of the transistors in the first sub hole region is identical to a layout pattern for all of the transistors in the second sub hole region.

18. The semiconductor memory device as recited in claim 7, wherein a layout pattern for all of the transistors in the first sub hole region is identical to a layout pattern for all of the transistors in the second sub hole region and a layout pattern for all of the transistors in the third sub hole region.

* * * * *